United States Patent [19]

Schmid

[11] 4,013,886

[45] Mar. 22, 1977

[54] LIGHT PROJECTOR AND DETECTOR UNIT

[75] Inventor: August Schmid, Schwerzenbach, Switzerland

[73] Assignee: Patentverwertungs-und Finanzierungsgesellschaft Serania AG, Glarus, Switzerland

[22] Filed: Feb. 18, 1975

[21] Appl. No.: 550,263

[30] Foreign Application Priority Data

Feb. 21, 1974 Switzerland .................. 2427/74

[52] U.S. Cl. .................. 250/221; 250/239; 340/258 B

[51] Int. Cl.² ...................... G01D 21/04

[58] Field of Search .............. 250/221, 222, 239; 340/258 B; 256/209; 356/199, 72, 227, 218

[56] References Cited

UNITED STATES PATENTS 3,041,461  6/1962  Lindemann et al. .............. 356/199
3,578,978  5/1971  Laurent ........................ 250/221
3,619,629  11/1971 Matthews ....................... 250/221
3,816,745  6/1974  Primm et al. ................... 250/221

Primary Examiner—Vincent P. McGraw
Attorney, Agent, or Firm—William R. Woodward

[57] ABSTRACT

The light beam projector and the directive light receiver of a light barrier intrusion detector are mounted side by side on a common mounting body which is angularly adjustable in a fixed casing, so as to direct the projected light for maximum reflection to the receiver by a remote mirror. A light emitting diode is provided as a visible indicator on or near the casing or the mounting and responds to the photosensitive element of the receiver through an intermediate amplifier, so that its brightness enables the effectiveness of the directional adjustment to be easily observed.

8 Claims, 4 Drawing Figures

LIGHT PROJECTOR AND DETECTOR UNIT

This invention relates to a light gate object sensing and detector unit of the kind in which the light source and the light receiver are located at the same end of the path of the light beam which is monitored in order to detect intrusion of an object across the light barrier path that interrupts the light beam.

In this type of light gate or barrier device, operating on a reflection principle, the beam of light sent out by the light projector is reflected back by a remote mirror to a light detector located near the projector. The space supervised by the light barrier device for possible intrusions is, thus, between the light source and the mirror. The problem then arises to direct the light beam reflected by the mirror exactly to the middle of the light receiver. This requires time-consuming adjustment work. Moreover, it can happen that the adjusted mirror setting is changed by external influences — for example, by mechanical shock — without the fact becoming immediately visible, as the result of which a possibility of false operation or false signalling by the device arises.

Subject Matter of the Present Invention

Briefly, the light projector and light receiver unit is provided with an optical indicator energized through an amplifier in response to the output of the photoelectric element of the light receiver. Both the light projector and the light receiver have optical systems making them effective principally in the direction of the remote mirror, and the light projector and the light receiver are, accordingly, mounted on a common mounting body the position of which can be adjusted while the results are observed by the response of the indicating device, which can conveniently be a light emitting diode. In order to allow all the adjustment to be made where the light projector, light receiver and indicating device are located, the mirror at the remote end of the light barrier may conveniently be constituted as a corner reflector, so that it will provide a reflected ray substantially on the return path without the exact orientation of the corner reflector being critical.

The optical indication device for observing the effectiveness of the alignment may be made separable from the rest of the projector-receiver unit, so that it may be plugged in for the alignment operation, or to check the alignment, and removed at other times.

The adjustment of the directivity of the projector and receiver is preferably made by first fixing the casing of the device in a fixed and approximately correct position and then adjusting a mounting plate pivoted on a central point by means of three symmetrically distributed screws, the mounting plate being held against the positioning screws by springs.

Particularly if the visible indicator is a permanent feature of the unit set in a socket in the casing of the unit, it is possible to determine easily and reliably without close inspection of the unit whether the light gate is correctly adjusted.

The invention is further described by way of an illustrative example, with reference to the accompanying drawings, in which.

Figure 1:
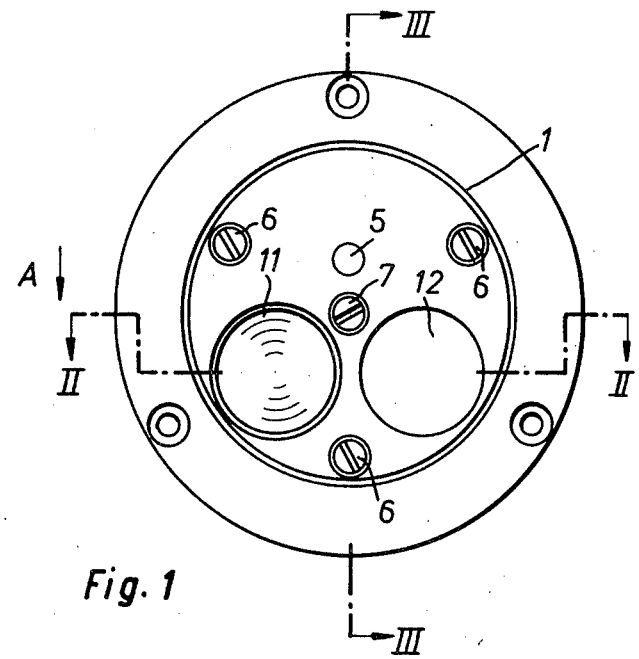
FIG. 1 is a front view of the projector-receiver unit in its casing.

Inside the pot-shaped casing 1 made of synthetic resin material or the like is located a mounting body 2 that is removable from the casing 1 and has a front side 3. The mounting body 2 carries a light projector utilizing an electric lamp 9, which may be either a gas discharge lamp or an incandescent lamp, and also a light receiver which includes a photosensitive diode 10 (see FIGS. 1 and 2). The bayonnet type socket 8 of the lamp 9 is seated on a plate 4 which also carries the photodiode 10. The plate 4 is rigidly fixed to the mounting body 2 by a screw 23 (FIG. 3).

Between the front side 3 of the mounting body 2 (i.e. the open side of the pot-shaped casing 1) and the lamp 9 and, likewise, between the front side 3 and the photodiode 10, there is a cavity open to the front in which the respective optical systems 11 and 12, formed of light gathering lenses, are set in order to project and receive the rays in substantially unidirectional bundles. The mounting body 2 is held in the casing 1 by a three-point suspension. Three screws 6 accessible from the front side are engaged in threaded bushings fixed in the back portion of the casing 1. The body 2 and lens 11 are flush in front with casing 1. Helical springs 13 produce a counterforce between the casing 1 and the mounting body 2. It is thus possible to swing the mounting body 2 within the casing 1 within certain limits by turning the screws 6, and in this manner the mounting body 2 can be adjusted in such a way that the bulk of the beam of light reflected by the remote stationary mirror 26, diagrammatically shown in FIG. 4, but not shown in FIGS. 1–3, passes through the lens 12 and is thereby concentrated on the photodiode 10. If the mirror 26 is relatively far from the projector-receiver, the projection path and the return path virtually coincide, in which case the mirror may be either a plane mirror or a corner reflector, the latter not requiring so critical an adjustment in order to send the light back on the same or a closely parallel path.

Figure 3:
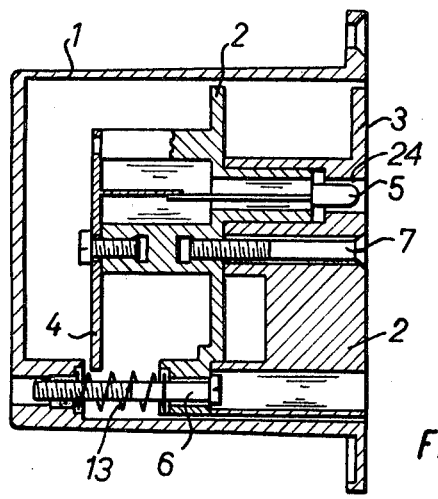
FIG. 3 is a cross-section of the unit shown in FIG. 1 through the line III—III of FIG. 1.
Figure 4:
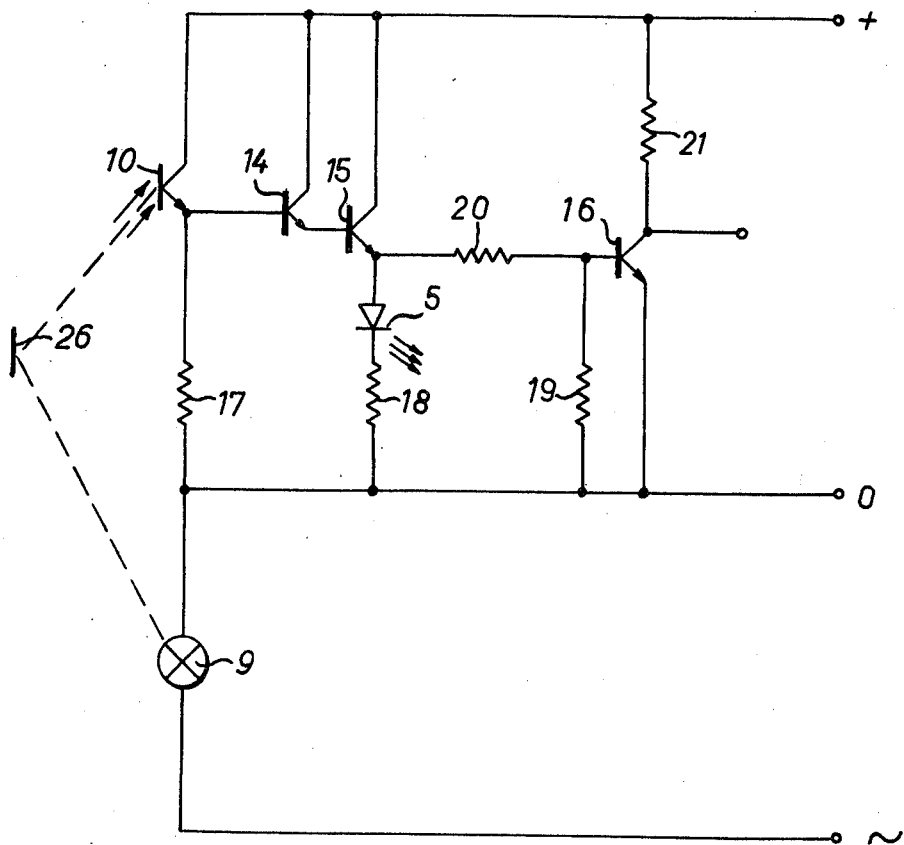
FIG. 4 is a circuit diagram of the light barrier intrusion detector device.

As shown in FIGS. 1 and 3, there is a light emitting diode 5 in the middle portion of the mounting body 2 seated in a recess 24 opening to the front side of the mounting body. As shown in FIG. 4, the light emitting diode 5 is connected to the output of an amplifier having two transistors 14 and 15 and the input of the amplifier is connected electrically to the output of the photodiode 10.

The details of the electrical circuit may be seen in FIG. 4. The lamp 9 is connected to an alternating current power source which may be the usual power mains. A direct current source, not shown, is provided between the ground side of the alternating current line and a positive d.c. voltage supply bus 25. Where the electrical construction code so requires, the alternating current return on the ground side of the lamp 9 may be made separate from the direct current return on the negative side of the battery or other d.c. voltage source, as is well understood. The photosensitive diode 10, a device sometimes called a phototransistor, has one terminal connected to the positive pole of the direct current source and its other terminal connected to the negative pole or ground bus 26 through a resistor 17 and also connected directly to the control terminal (base electrode) of the transistor 14. Current produced in the photodiode 10 as the result of incident light is provided, by the last-mentioned connection, to the amplifier circuit built around the two transistors 14 and 15, which are connected together in the well-known Darlington circuit. Between the emitter of the transistor 15 and the ground bus 26 (i.e. in the load circuit of the amplifier) there are, in series, the light emitting diode 5 and a resistor 18. Across this series combination is the voltage divider made up of resistors 20 and 19, to the common connection of which the base electrode of a third transistor 16 is connected, which has its emitter connected to the ground bus 26 and its collector connected to the positive supply bus 25 through a load resistor 21. The collector of the third transistor 16 is also connected, through an output connection 27, to a suitable output terminal 28 which may be connected to an alarm system or other utilization system or device for providing a warning that there has been an intrusion across the light barrier.

The current supplied to the light emitting diode 5 is accordingly dependent upon the current passing through the phototransistor 10, and hence also dependent on the light intensity with which the photodiode 10 is illuminated. The light intensity of the light emitting diode is greatest when the light beam reflected back from the mirror 26 falls directly on the optical axis of the light receiver or more precisely, the axis of its optical system 12. It is assumed that the mirror 26 is remote enough that at the same time as the optical system 12 is aimed at the mirror 26, the optical system 11 of the projector, which is directed substantially parallel thereto, will also concentrate its light most effectively on the mirror 26. Thus, by adjusting only the mounting body 2 by suitably turning the screws 6, the projector-receiver can be adjusted precisely in the desired direction.

In place of a light emitting diode fixedly built into the mounting body 2 as shown in FIG. 1 and FIG. 3, an electrical connector device, which may be either simple terminals or part of a mating plug and socket pair, can be provided which is accessible from the outside of the casing 1 or of the mounting body 2, in which case the light emitting diode or some other optical indicating device may be demountably attached or connected to the casing or the mounting body in order to carry out or check the alignment with the mirror 26, without the necessity of leaving it connected all the time. Another device usable as an optical indicating device is the so-called "magic eye tube," sometimes used in radio apparatus.

Instead of the usual incandescent lamp or glow lamp, the light projector may utilize an infrared light source (which requires special lenses for its optical system), or the light projector may be constituted by a laser, which is a coherent light beam generator.

Figure 2:
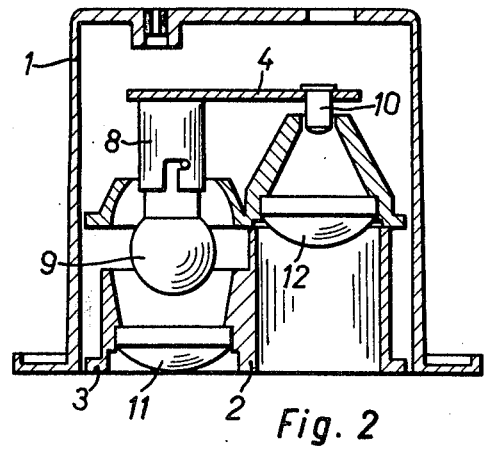
FIG. 2 is a cross-section of the unit shown in FIG. 1 through the line II—II of FIG. 1.

In FIGS. 1-3, the mounting body 2 is shown as made of two parts fastened together with a single central screw 7. This mounting body could also be made of a single piece or, on the other hand, of three or more pieces.

It will thus be seen that variations are possible within the inventive concept.

I claim:

1. Light gate object sensing and detector unit for use with a reflecting device at the end of the gate path remote from the detector, said unit comprising:
    means for projecting a beam of light towards said reflecting device, the direction of projection of said beam being the principal light projection direction of said means;
    light responsive receiving means for receiving light from said reflecting device, said light responsive receiving means being located adjacent said light projecting means, having a preferential light reception direction substantially parallel to said principal light projection direction, and including photoelectric means (10) for producing an electric signal in response to light received;
    a casing open at the front housing said projecting means and said receiving means;
    adjustable support means for both said projecting means and for said receiving means, located within said casing and including a mounting body forming a front for the unit in which said projecting means and photoelectric means are set with their respective light projection and preferential light reception directions frontwardly directed and including also means for angularly adjusting simultaneously with two degrees of freedom the direction of projection of said projecting means and the preferential light reception direction of said receiving means;
    optical alignment indicating means (5) including a light-emitting diode carried on said support means so as to be visible from the exterior of the unit for indicating the intensity of light received from said reflecting means by said receiving means, and
    a two-stage transistor amplifier (14, 15) having its input connected to the output of said photoelectric means (10) and having its output connected to said light-emitting diode and also to an additional output terminal for providing an object detecting output distinct from the output of said alignment indicating means.

2. Light unit as defined in claim 1, in which said photoelectric means comprises a phototransistor (10) connected to the input of said amplifying means and in which a third transistor (16) is provided having its input connected to the output of said two-stage transistor amplifier (14, 15) for supplying said detecting output distinct from said alignment indicating means.

3. Light unit as defined in claim 1, in which said mounting body (2) is held on a three-point suspension at an angular position with respect to said casing which is variable by three screws (6) accessible to the exterior of the casing.

4. Light unit as defined in claim 1, in which said indicating means (5) is seated in a cavity (24) provided in said mounting body (2) which cavity is open to the front side (3) of said casing.

5. Light unit as defined in claim 1, in which said means for projecting a beam of light is a means for projecting a beam of infrared light and said receiving means is responsive to infrared light.

6. Light unit as defined in claim 1, in which said light-emitting diode is set in the front portion of said support means and is visible from the front of the unit and in which said adjusting means are adjustable from the front of the unit.

7. Light unit as defined in claim 6, in which said adjusting means comprises three screws by which the precise direction faced by the front of said support means can be adjusted and in which said casing is of pot shape suitable for insertion in a cavity with its front flush with the opening of said cavity.

8. Light unit as defined in claim 6 in which said adjusting means is a three-point suspension and comprises three screws (6) accessible from the front of the casing.

* * * * *